United States Patent [19]

Toyoda et al.

[11] 4,438,315
[45] Mar. 20, 1984

[54] HIGH SELECTIVITY PLASMA ETCHING APPARATUS

[75] Inventors: Hiroyasu Toyoda; Hiroyoshi Komiya; Hideaki Itakura, all of Kanagawa, Japan

[73] Assignee: VLSI Technology Research Association

[21] Appl. No.: 296,407

[22] Filed: Aug. 26, 1981

Related U.S. Application Data

[62] Division of Ser. No. 183,710, Sep. 3, 1980, Pat. No. 4,348,557.

[30] Foreign Application Priority Data

Dec. 12, 1979 [JP] Japan .............................. 54-163006

[51] Int. Cl.³ .......................... B23K 9/00; C23F 1/02
[52] U.S. Cl. ..................... 219/121 PE; 219/121 PG; 219/121 PR; 156/646
[58] Field of Search .................. 219/121 PD, 121 PE, 219/121 PG, 121 PF; 156/646, 643, 345; 204/192 E, 164; 427/38

[56] References Cited

U.S. PATENT DOCUMENTS

| 3,971,684 | 7/1976 | Muto et al. | 156/646 |
| 3,994,793 | 11/1976 | Harvilchuck et al. | 219/121 PD |
| 4,062,102 | 12/1977 | Lawrence et al. | 219/121 PD |
| 4,073,669 | 2/1978 | Heinecke et al. | 156/646 |
| 4,097,618 | 6/1978 | Poliniak | 156/646 |
| 4,333,814 | 6/1982 | Kugel | 156/643 |

FOREIGN PATENT DOCUMENTS 53-114679  10/1978  Japan ........................... 219/121 PD Primary Examiner—M. H. Paschall
Attorney, Agent, or Firm—Sughrue, Mion, Zinn, Macpeak & Seas

[57] ABSTRACT

A parallel-plate type gas plasma etching apparatus for etching a workpiece having a multilayer structure having a high etch rate ratio. A pair of parallel-plate electrodes are disposed in a reactor. A workpiece to be etched is disposed upon one of the electrodes. The reactor is held at a predetermined pressure and an etching gas supplied thereto. Rf power is applied between the electrodes with the positive terminal of the rf generator being coupled to the electrode upon which the workpiece is disposed. The frequency of the rf power is 10 MHz or less.

4 Claims, 5 Drawing Figures

HIGH SELECTIVITY PLASMA ETCHING APPARATUS

This is a division of application Ser. No. 183,710, filed Sept. 3, 1980, U.S. Pat. No. 4,348,557.

BACKGROUND OF THE INVENTION

The present invention relates to a method and apparatus for etching a workpiece having a multilayer structure using a parallel-plate type gas plasma etching apparatus.

The use of a parallel-plate type gas plasma etching apparatus has been known in the art for etching a material with high precision. With such an apparatus, the choice between the anode and the cathode coupling mode is dependent on the frequency of the rf power to be used. For example, if the frequency of the rf power is 13.56 MHz, the rf power is applied either to the one of the electrodes on which the workpiece is disposed (the cathode coupling mode) or to the opposite electrode (the anode coupling mode). For frequencies of 400 kHz or lower, the anode coupling mode is usually employed.

In a case of the plasma etching of a workpiece having a multilayer structure, it is required that the etch rate of the material to be etched E(E) be high enough practically with respect to the etch rate of an underlying layer E(u) to obtain a high etch rate ratio $R(E/u) = E(E)/E(u)$.

An object of the present invention is to provide a method with which a workpiece having a multilayer structure is etched using a parallel-plate type gas plasma etching apparatus in which a high etch rate ratio R(E/u) is realized.

SUMMARY OF THE INVENTION

This, as well as other objects of the invention, are met by a parallel-plate type gas plasma etching apparatus including a reactor and a pair of parallel-plate electrodes disposed in the reactor with one of the electrodes being adapted to receive a workpiece disposed thereon. The reactor is supplied with an etching gas at a preferred pressure. An rf generator is coupled between the electrodes with the high voltage terminal of the rf generator connected to the electrode upon which the workpiece is disposed. The frequency of the rf power is preferably no higher than 10 MHz. The preferred etching gas is $CHF_3$. The workpiece may, for example, be a silicon substrate and a silicon oxide layer formed upon the substrate. The invention also encompasses a method for operating the apparatus.

DESCRIPTION OF THE PREFERRED EMBODIMENTS

The present invention will now be described in detail with reference to a workpiece having a multilayer structure composed of a substrate of Si and a covering layer of silicon dioxide ($SiO_2$) formed on the substrate as an example.

According to the description in *Solid State Electronics*, vol. 8, pp. 1146–1147 (1975), fluorine radicals (F*), carbon trifluoride radicals ($CF_3^*$) and/or carbon trifluoride ions ($CF_3^+$) dissociate from a fluoride such as carbon tetrafluoride ($CF_4$) in the gas plasma state. This fact has been used for gas plasma etching. Also it has been known from the above article that F* is quite reactive with Si and $CF_3^*$ and $CF_3^+$ and hence reactive with $SiO_2$. Therefore, if the concentration of F* can be reduced in some way, the etch rate of Si is reduced and thus the etch rate ratio of $SiO_2$ to Si $R(SiO_2/Si)$ becomes high thereby making it possible to preferentially etch a $SiO_2$ layer. Taking into account the above considerations, a number of gases containing various constituents have been proposed for plasma etching. Fluorides containing hydrogen and a gas mixture of hydrogen gas and a fluoride are typical examples among these. Even when such an etching gas is used, the etch rate ratio $R(SiO_2/Si)$ is not so high as desired and is typically of the order of 10 at most using the known parallel-plate type gas plasma etching apparatus.

On the contrary, utilizing the gas plasma etching method of the invention with a parallel-plate type gas plasma etching apparatus, the etch rate of $SiO_2$ $E(SiO_2)$ is satisfactorily high while the etch rate of Si $E(Si)$ is reduced to a low value resulting in a practically usable high etch rate ratio $R(SiO_2/Si)$.

The method of the present invention and the effects thereof will be described in detail with reference to experiments conducted by the inventors for identical workpieces 6 each composed of a substrate 4 of Si and a layer 5 of $SiO_2$ formed preferentially on the substrate.

Experiment 1

Figure 1:
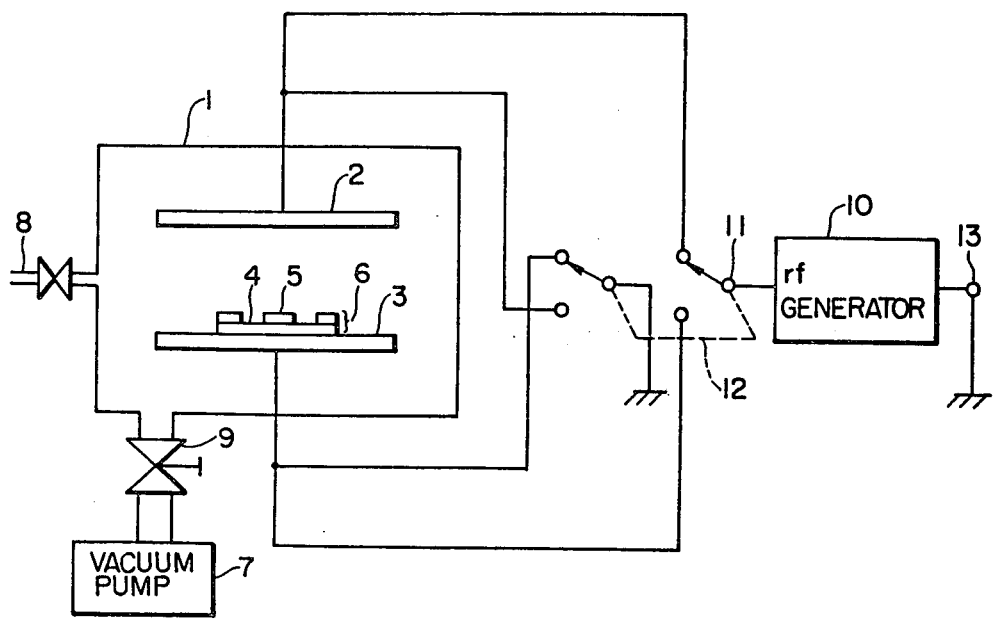
FIG. 1 is a diagram of an experimental parallel-plate type gas plasma etching apparatus.
Figure 2:
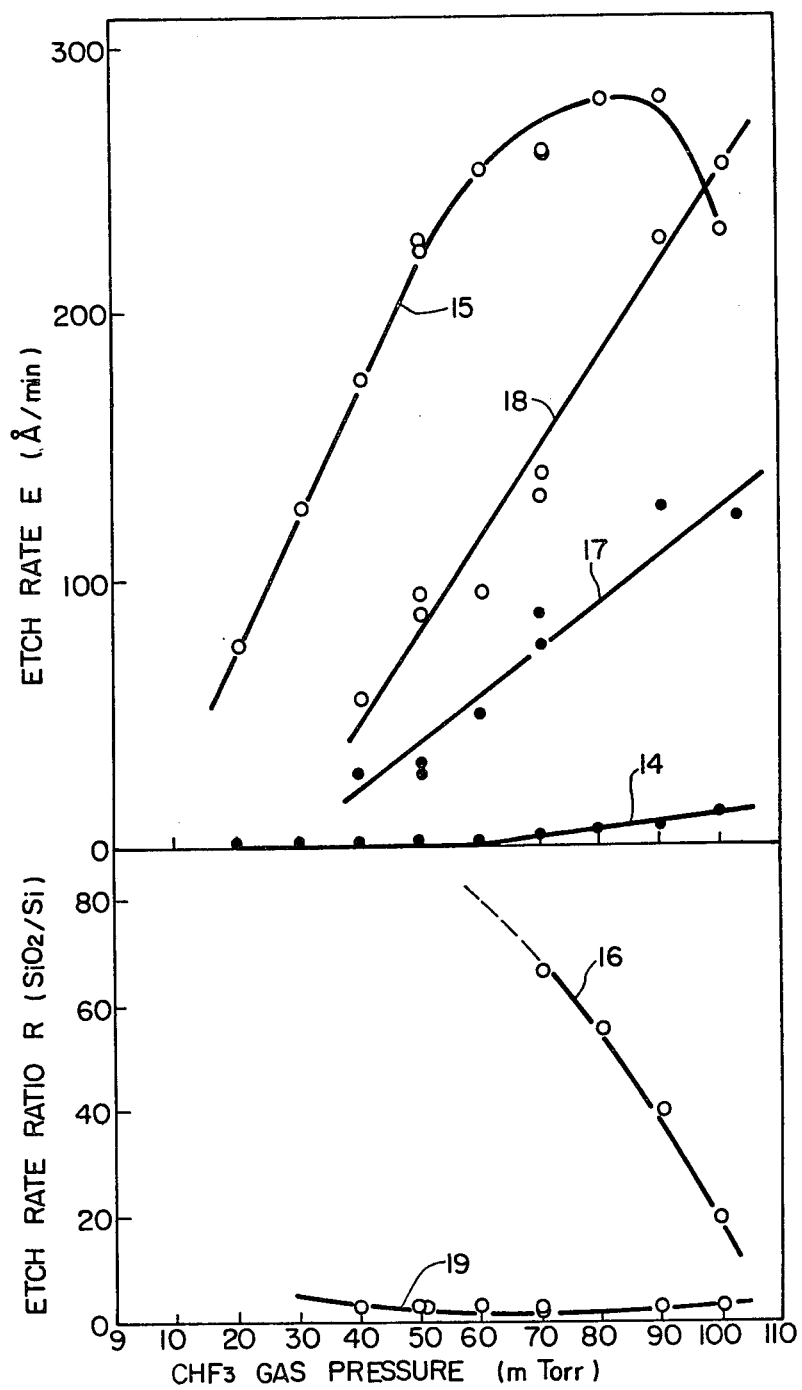
FIGS. 2–4 are graphs showing plots of etch rate and etch rate ratio versus gas pressure for the apparatus of FIG. 1 for various frequencies of the rf power.

Part (a). The parallel-plate type gas plasma etching apparatus shown in FIG. 1 was used. A workpiece 6 was disposed on a lower electrode 3 which is parallel and opposite to an upper electrode 2 in a reactor 1 of the parallel-plate type gas plasma etching apparatus. The reactor 1 was evacuated by a vacuum pump 7. After the gas pressure in the reactor 1 reached or was lower than 0.1 mTorr, trifluoromethane ($CHF_3$), which is a type of fluoride gas containing hydrogen, was introduced through a gas guide tube 8 to the reactor at a constant flow rate while controlling the gas pressure in the reactor 1 to be 20 to 100 mTorr with the use of a variable conductance value 9 arranged between the reactor 1 and the vacuum pump 7. A high voltage terminal 11 of and rf generator 10 of 400 kHz was connected through a first section of a switch 12 to the lower electrode 3 on which the workpiece 6 is disposed while the upper electrode 2 was connected through a second section of the switch 12 to a ground terminal 13 of the rf generator 10 (the cathode coupling mode). The rf generator 10 was turned on to establish a high electric field between the electrodes 2 and 3 and to thereby cause generation of $CHF_3$ gas plasma. Under these conditions, etching was performed. As a result, the $SiO_2$ layer 5 on the Si substrate 4 and portions of the substrate 4 which are exposed were etched at the rates shown by Si etch rate curve 14 and $SiO_2$ etch rate curve 15 in FIG. 2. A curve 16 in the same figure is a plot of the etch rate ratio of $SiO_2$ to Si.

Part (b). The above etching process was performed on workpiece 6 under the same conditions as those in Part (a) except that the high voltage terminal of the rf generator 10 was connected to the upper electrode 2 and the lower electrode 3 was connected to the ground so that the plasma state of the CHF$_3$ gas was established by the anode coupling mode. As a result, exposed portions of the Si substrate 4 and the SiO$_2$ layer 5 on the Si substrate were etched as shown by etch rate curves 17 and 18, respectively, of FIG. 2. A curve 19 is a plot of the etch rate ratio of SiO$_2$ to Si.

As is clear from the above results, etching of the workpiece 6 in the gas plasma by the cathode coupling mode provides a higher etch rate of SiO$_2$ E(SiO$_2$) and a lower etch rate of Si E(Si) and hence a higher etch rate ratio R(SiO$_2$/Si) was obtained with the cathode coupling mode than that with the anode coupling mode.

Experiment 2

Figure 3:
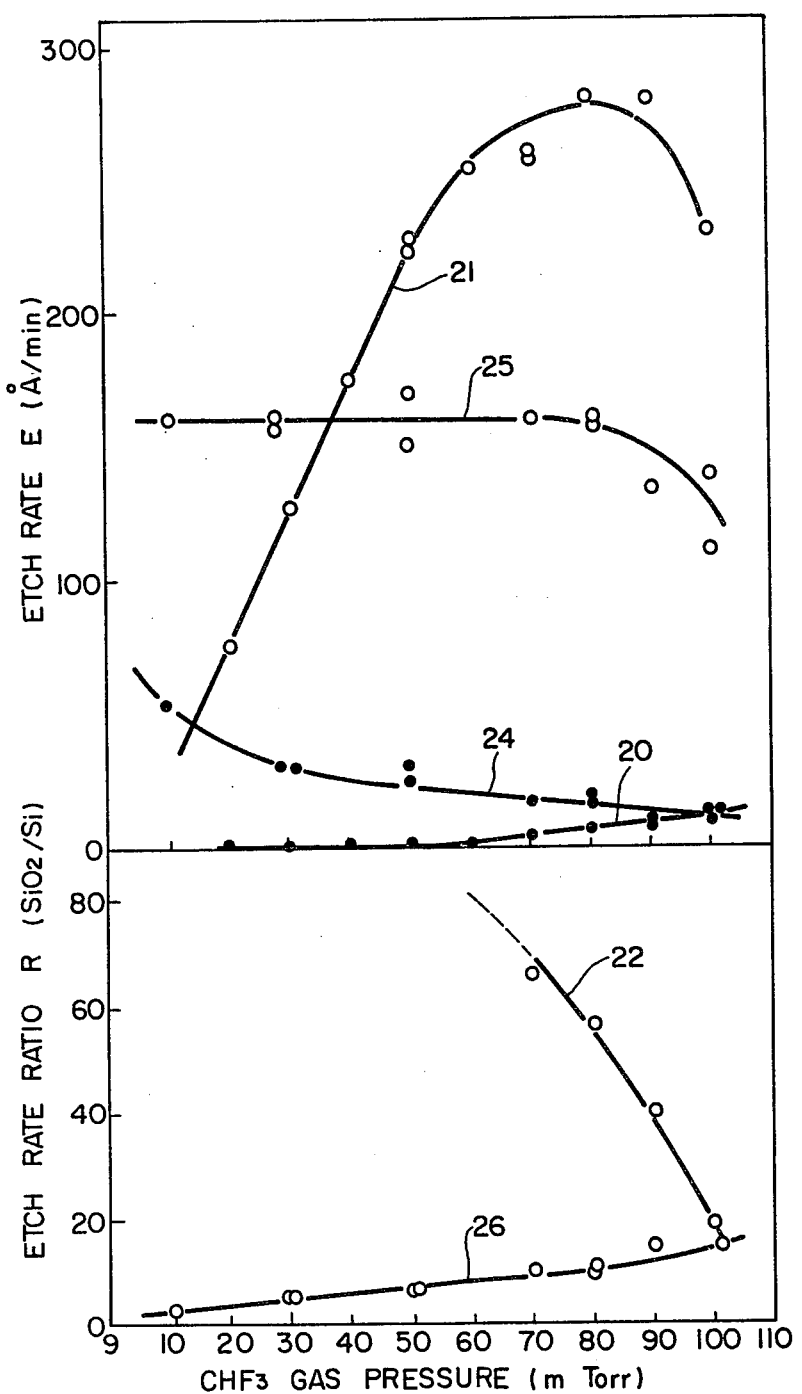

Part (a). A workpiece 6 was etched by using the parallel-plate gas plasma etching apparatus shown in FIG. 1 under the same conditions as those used in Part (a) of Experiment 1 except that the pressure of CHF$_3$ gas was set to be in a range of from 10 mTorr to 100 mTorr by controlling the evacuation speed with the variable conductance valve 9. The etch rates of both Si and SiO$_2$, and the etch ratio R(SiO$_2$/Si) obtained are shown by curves 20, 21 and 22 in FIG. 3, respectively.

Part (b). An identical etching process to that performed in Part (a) of Experiment 2 was performed with the exception that the frequency of the rf power used was 13.56 MHz. The results are shown by etch rate curves 24 and 25 in FIG. 3 for Si and SiO$_2$, respectively. The measured etch rate ratio is shown by a curve 26. These results clearly show that when the frequency of the rf power is lowered from 13.56 MHz to 400 kHz, the etch rate of Si is decreased without decreasing the etch rate of SiO$_2$ causing the etch rate ratio R(SiO$_2$/Si) to increase.

Experiment 3

Figure 4:
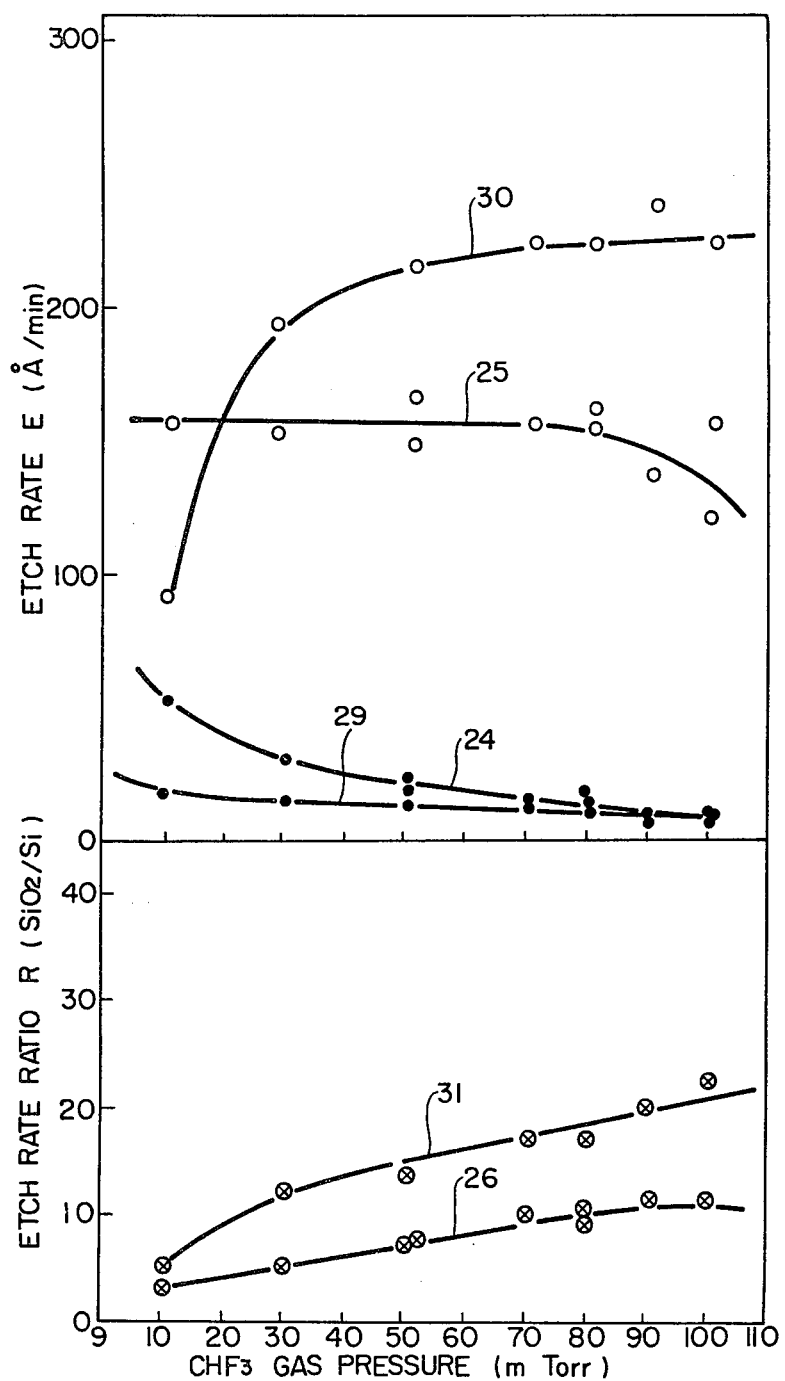

An identical etching process to that performed in Part (a) of Experiment 1 was performed with the exception that the frequency of the rf power used was 2 MHz. The results are shown by etch rate curves 29 and 30 in FIG. 4 for Si and SiO$_2$, respectively. The etch rate ratio R(Si/SiO$_2$) is shown by a curve 31 in the same figure. From the measured results, it is clear that the lower the frequency used with the cathode coupling mode the higher is the etch rate of SiO$_2$ E(SiO$_2$) and the higher is the etch rate ratio R(SiO$_2$/Si).

The present invention is based on these experimental results. Embodiments of an apparatus of the present invention will now be described.

Figure 5:
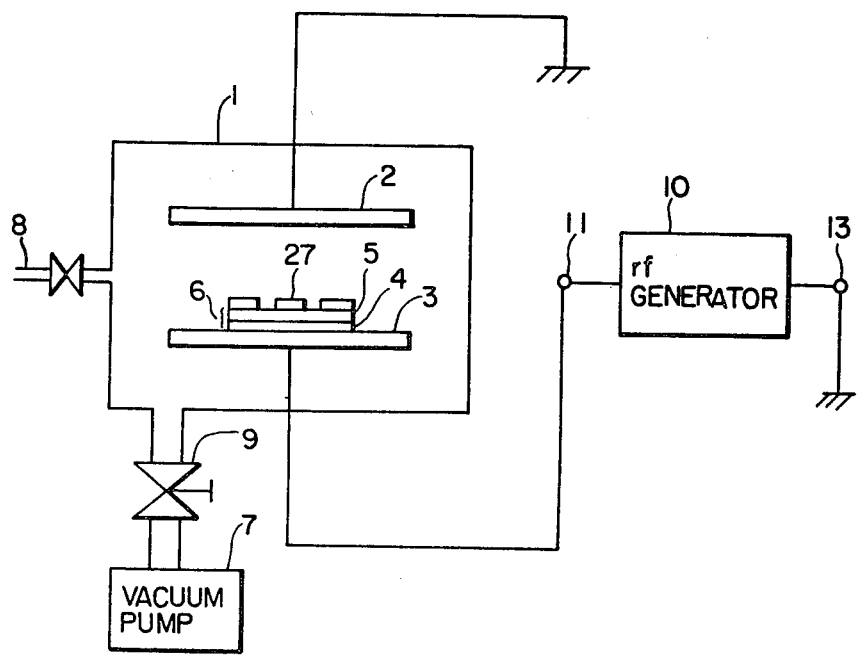
FIG. 5 is a diagram of a parallel-plate type gas plasma etching apparatus of the invention.

FIG. 5 illustrates schematically a parallel-plate type gas plasma etching apparatus of the invention. The apparatus includes a reactor 1, a pair of parallel-plate electrodes 2 and 3 made of stainless steel and disposed face-to-face in the reactor, a vacuum pump 7, a gas introduction pipe 8, a variable conductance valve 9 and a rf generator having an output frequency of 400 kHz. The electrode 3 on which a workpiece 6 is disposed is connected to a high voltage terminal 11 of the rf generator 10 and the electrode 2 is connected to the ground terminal 13 of the rf generator 10. The variable conductance valve 9, which is provided to regulate the gas pressure in the reactor 1, may be dispensed with if desired. The workpiece 6 may, for example, be a Si substrate 4 with a SiO$_2$ layer 5 to be etched formed on the substrate and a photoresist layer 27 formed in a desired pattern on the SiO$_2$ layer 5.

The reactor 1 is evacuated by the vacuum pump 7 while CHF$_3$ gas is introduced thereinto at a rate, for instance, of 24 cc/minute through the gas introduction pipe 8. The exhaust rate is regulated by the variable conductance valve 9 so that the gas pressure in the reactor 1 is maintained at about 60 mTorr. Rf power, for example, corresponding to 2.5 A of rf current, is supplied from the rf generator 10 to the lower electrode 3 to generate plasma which etches the portions of the SiO$_2$ layer 5 not covered by the photoresist layer 27. Under these condition, an etch rate of 280 Å/min has been obtained with the use of the invention. After the desired portions of the SiO$_2$ layer was etched completely, undesirable etching of the Si substrate is not observed although the etching conditions are maintained.

As mentioned hereinafter in detail, the parallel-plate type gas plasma etching method and apparatus according to the present invention in which rf power at a frequency of 10 MHz or lower is applied to the electrode on which the workpiece to be etched is disposed to produce a gas plasma by which etching is performed provides a desirably high etch rate for only the particular layer to be etched thereby providing a high etch rate ratio.

What is claimed is:

1. A parallel-plate type gas plasma etching apparatus for preferentially etching a workpiece having a multi-layer structure composed of layers of Si and SiO$_2$, comprising: a reactor; a pair of parallel-plate electrodes disposed in said reactor, one of said electrodes being adapted to receive a workpiece disposed thereon; means for supplying said reactor with an etching gas consisting of CHF$_3$ at a pressure of 10 mTorr to 100 mTorr; and rf power generator means for applying rf power between said electrodes in a cathode-coupling mode by a rf power generator to cause said etching gas to assume a plasma state, the output frequency of said rf power generator means being limited to a range of 400 KHz to 10 MHz, and wherein the one of said electrodes upon which said workpiece is disposed is connected to a high voltage output terminal of said rf power generator and the other of said electrodes is grounded.

2. The parallel-plate type gas plasma etching apparatus as claimed in claim 1 wherein said workpiece comprises a silicon substrate and a silicon oxide layer formed upon said silicon substrate.

3. The parallel-plate type gas plasma etching apparatus of claim 1 wherein said etching gas supplying means comprises a gas introduction pipe and means for supplying CHF$_3$ gas through said gas introduction pipe.

4. The parallel-plate type gas plasma etching apparatus of claim 1 further comprising a variable conductance valve for regulating the gas pressure in said reactor.

* * * * *